CURRENT STEERED LOGIC CIRCUITS
Filed July 27, 1964 2 Sheets-Sheet 1
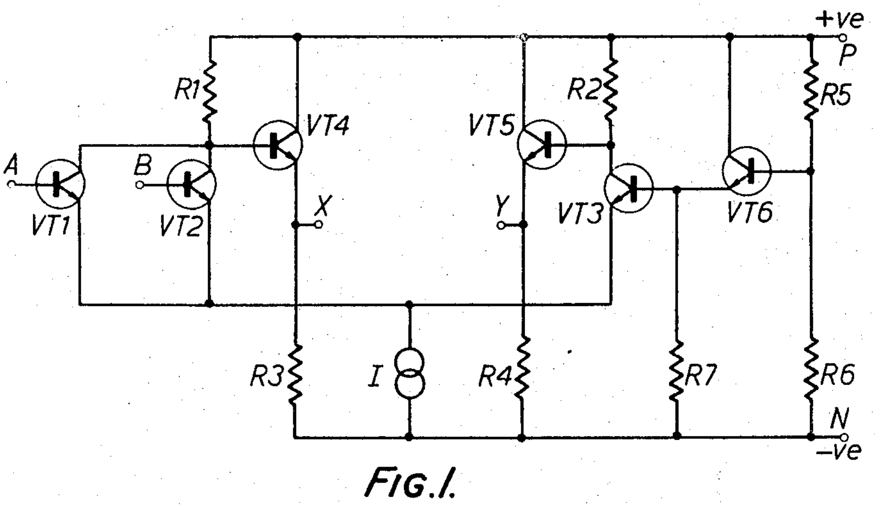
FIG. 1.
| A | B | X |
|---|---|---|
| 0 | 0 | 1 |
| 1 | 0 | 0 |
| 0 | 1 | 0 |
| 1 | 1 | 0 |
FIG. 1B.
| A | B | Y |
|---|---|---|
| 0 | 0 | 0 |
| 1 | 0 | 1 |
| 0 | 1 | 1 |
| 1 | 1 | 1 |
FIG. 1A.
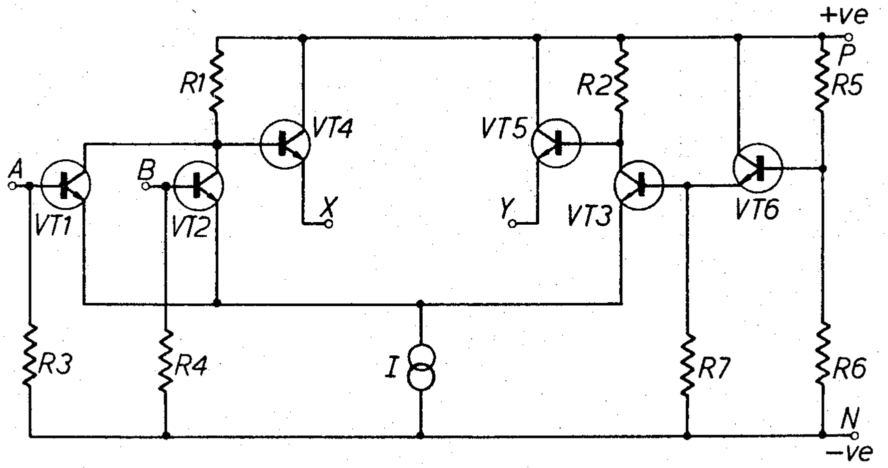
FIG. 2.
ROGER S. DUNN &
CARL S. DEN-BRINKER
INVENTORS
BY John G. Graham
ATTORNEY

CURRENT STEERED LOGIC CIRCUITS

Filed July 27, 1964 2 Sheets-Sheet 2

ROGER S. DUNN &
CARL S. DEN-BRINKER
INVENTORS

BY John G. Dunham

ATTORNEY

United States Patent Office 3,328,603

Patented June 27, 1967

3,328,603

CURRENT STEERED LOGIC CIRCUITS

Roger Stanley Dunn and Carl Siegmund den-Brinker, Bedford, England, assignors to Texas Instruments Incorporated, Dallas, Tex., a corporation of Delaware Filed July 27, 1964, Ser. No. 385,222

Claims priority, application Great Britain, Aug. 1, 1963, 30,640/63

1 Claim. (Cl. 307—88.5)

This invention relates to logic circuits and in particular to current steered NOR and NAND logic circuits.

Current steered logic circuits are switching or gate circuits in which the significant signal is a current pulse as opposed to a voltage pulse and it is known to employ transistors as the switching elements in those circuits.

Although a current steered logic circuit will give the fastest operating speed of which a particular transistor is capable, prior proposed circuits of this type suffer from a number of disadvantages. They may require more than one voltage source, the power supplies need to have close tolerance limits and the power dissipated in the circuits is relatively high.

The purpose of the invention is to provide a circuit in which the disadvantages mentioned are minimised.

According to the present invention a current steered logic circuit comprises two parallel connected current flow paths including transistors and connected to a common current source, a first one of the two paths including at least two parallel connected switching transistors separately switchable to divert significant current flow from the current source through one of the two current flow paths, output transistors coupled to the respective current flow paths to produce an output dependent on the presence of a significant or an insignificant current flow in the associated current flow path; the output transistors being so connected that they can conduct only in the presence of an external circuit connection to their output terminals, and coupling resistors connected to the input electrodes of the respective switching transistors for supplying the switching-off current for those transistors.

Such a circuit may be constructed to take maximum advantage of the fast switching times of switching transistors currently available whilst, when the output from one such circuit is used to supply an input to one or more similar circuits, making the power dissipation produced proportional to the number of circuits being switched. In addition, such a circuit gives the possibility of inherent reduction of response to noise signals and it also requires only a single power supply source.

The switching transistors may be arranged in commoned emitter configuration, and the output signals derived from the emitter electrodes of the output transistors.

In one form of circuit embodying the invention the base bias of the transistor in the second current flow paths is controlled by a resistor-transistor network.

Alternatively, the base bias of the transistor in the second of the current flow paths may be controlled by a Schmitt trigger configuration of which the switching transistors in the first current flow path form part, so that in operation of the logic circuit there arises hysteresis between the voltage level of an input signal to a switching transistor and the voltage level on the base electrode of the output transistor associated with the first of the current flow paths.

A plurality of logic circuits according to the invention may be coupled together with the output electrode of at least one of the output transistors of one logic circuit connected in parallel to the input electrodes of one of the switching transistors included in the first current flow paths of the remaining logic circuits, the switching-off current for each switching transistor being supplied by the coupling resistor connected to the input electrode of that transistor so that each coupling resistor supplies only the switching-off current for one switching transistor.

The invention will now be described in greater detail, by way of example, and with reference to the accompanying drawings in which:

FIG. 1 shows a prior proposed current steered NOR logic circuit,

FIGS. 1A and 1B show symbolically the function of the logic circuit of FIG. 1,

FIG. 2 shows a NOR logic circuit embodying the invention,

Figures 3, 4, 5:
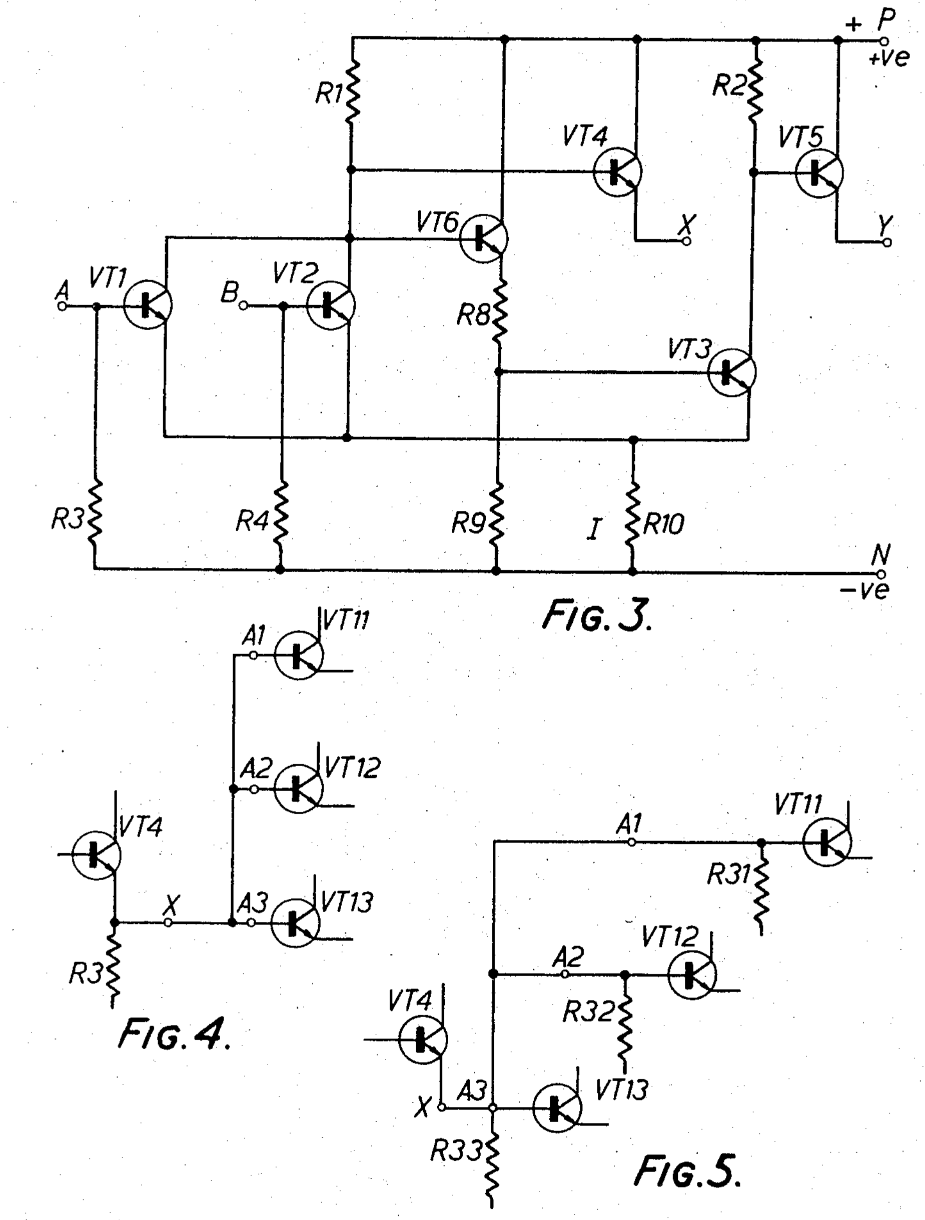
FIG. 3 shows an alternative embodiment of the invention.
FIG. 4 shows the manner in which the output of a prior proposed logic circuit is coupled to the inputs of three similar circuits.
FIG. 5 shows the manner in which the output of a logic circuit according to the invention is coupled to the inputs of three similar circuits.

A prior proposed NOR logic circuit is illustrated in FIG. 1. A current source I, which may be a resistor, is connected to two parallel current flow paths, a first comprising a resistor R1, connected in series with parallel connected transistors VT1 and VT2, and the second comprising a resistor R2 connected in series with a transistor VT3. An input terminal A is connected to the base of transistor VT1, and an input terminal B is connected to the base of transistor VT2. Operatively associated with the first current flow path is an output transistor VT4 having its base connected to the collectors of both transistors VT1 and VT2. Operatively associated with the second current flow path is an output transistor VT5 having its base connected to the collector of transistor VT3. The collectors of transistors VT4 and VT5 and the resistors R1 and R2 are connected to a common positive supply terminal P. The emitters of transistors VT4 and VT5 are connected via resistors R3 and R4 respectively to a negative supply terminal N. Output terminals X and Y are connected to the emitters of transistors VT4 and VT5 respectively. The base bias of transistor VT3 is controlled by a resistor-transistor network comprising transistor VT6 and resistors R5, R6 and R7.

In operation of this prior proposed logic circuit with no external bias potential applied to the input terminals A and B the bases of transistors VT1 and VT2 are open circuit and the transistors are non-conductive. In addition, transistor VT3 is biased in the conducting state by the resistor-transistor network VT6, R5, R6 and R7. If the generator I is not an ideal current source then the resistor values in this network can be chosen in a well known manner to reduce variations in the voltage drop across the resistor R2 with supply voltage. The need for close tolerances on the supply voltage is thus obviated. With transistor VT3 in the conducting state a current flows from the current source I through transistor VT3 and resistor R2. If this current is of magnitude $i$ then the base of transistor VT5 is held at a potential $i$R2 volts below the positive supply potential. Transistor VT5 is connected as an emitter follower so that it is always in the conducting state. The potential at the output terminal Y is therefore the potential at the base of transistor VT5 less the base-emitter voltage drop of VT5 in the conducting state (i.e. $V_p - V_{BE} - i.R2$). However, if a sufficient forward biasing input potential is applied to either or both of terminals A and B, then current flows from the current source through either or both of the transistors VT1 and VT2 and through the resistor R1. The magnitude of the current flow through resistor R2 is thus reduced and consequently the base potential of transistor VT5 rises with a corresponding increase in the potential at output terminal Y. The input level to either transistor VT1 or transistor VT2 is normally sufficient to cause transistor VT3 to be cut-off.

Thus, in the presence of an input signal to one or both of terminals A and B which renders one or both of transistors VT1 and VT2 conductive (a significant input signal), the transistor VT3 is non-conducting and a significant signal level is produced at the output terminal Y. In the absence of a significant input signal to both terminals A and B, neither of the transistors VT1 and VT2 conducts, transistor VT3 is conductive and the signal level at the output terminal Y becomes insignificant. These conditions are summarised in the Truth Table of FIG. 1A in which the symbol "1" represents the presence of a significant signal and the symbol "0" represents the absence of a significant signal (or the presence of an insignificant signal) at the point indicated.

Considering now the left-hand portion of the logic circuit shown in FIG. 1, in the absence of a significant input signal at either terminal A or terminal B, no current flows through resistor R1 and the base of transistor VT4 is held at a potential equal to the positive supply voltage with transistor VT4 conducting. Under these conditions there is at the output terminal X a significant (1) signal having a potential equal to the positive supply voltage minus the base-emitter voltage of transistor VT4. If now a significant input signal is applied at one or both of the input terminals A and B, one or both of the transistors VT1 and VT2 conduct(s) and a current flows through resistor R1 reducing the base bias potential on transistor VT4 by *i*.R1. This results in an insignificant (0) signal at the terminal X. The function of this portion of the logic circuit is summarised in the Truth Table, FIG. 1B.

The prior proposed logic circuit illustrated in FIG. 1 and described above suffers from disadvantages. Power dissipation is relatively high and the switching transistors are vulnerable to accidental triggering by random noise voltages.

FIG. 2 illustrates a logic circuit according to the invention which overcomes at least in part the disadvantages inherent in the above described prior proposed logic circuit.

The basis of the invention, as shown in FIG. 2, lies in the transfer of the interstage coupling resistors R3 and R4 from the output to the input of the circuit. Thus, in FIG. 2, the resistors R3 and R4 are connected to the base electrodes of the switching transistors VT1 and VT2, respectively. The emitter electrodes of the output transistors VT4 and VT5 are connected solely to the output terminals X and Y respectively. The logical functioning of the circuit remains identical with that of the prior proposed logic circuit illustrated in FIG. 1, and the Truth Tables FIGS. 1A and 1B apply equally to FIG. 2.

It is frequently required to connect the outputs of one such logic circuit as illustrated in FIG. 2 in parallel to the inputs of one or more similar logic circuits.

The coupling together of circuits in this manner is referred to as "fan out." For example, a first circuit coupled to three similar circuits is said to have a fan out of three.

FIG. 4 illustrates the way in which coupling between logic circuits of the type shown in FIG. 1 is accomplished. The output terminal X of such a circuit is connected in parallel to the input terminals A1, A2, A3 of three further similar logic circuits. The single resistor R3 now has to supply the switching-off current for the three switching transistors VT11, VT12, and VT13 of the additional circuits and must have a resistance small enough to allow the stored charge of the switching transistors VT11, VT12 and VT13 to be removed as quickly as possible when these transistors are switching from the "on" to the "off" state. However, decrease in the resistance of resistor R3 to meet the switching time criterion, is accompanied by an undesirable increase in the power dissipation of that resistor.

The coupling mechanism between logic circuits according to the invention is illustrated by FIG. 5. Here the output terminal X of a first circuit is connected in parallel to the input terminals A1, A2 and A3 of three further logic circuits. However, in this arrangement each switching transistor VT11, VT12 and VT13 of the three further circuits is supplied with switching-off current by its own coupling resistor R31, R32, R33 respectively. Since each of these resistors is now required to supply the switching current for one transistor only, the value of each resistor may be higher than the value of the resistor R3 in FIG. 4. With a fan out less than the maximum, the total power dissipation is thus lower when logic circuits according to the invention are coupled together than when the prior proposed circuits are coupled.

An added advantage resulting from the connection of the resistors R3 and R4 in the manner shown in FIG. 2, is that the input impedance of each logic circuit is reduced by the presence of those input resistors, and this increases the immunity of the circuit to noise picked up from interconnecting wires between coupled circuits.

If the circuit has several input terminals and one or more of these is not connected to a signal source, the presence of the resistance between that input base terminal and the negative supply line ensures that the transistor is in the non-conducting state. Thus the risk of noise pick-up at the unused input terminal is greatly reduced. In addition, if one of the complementary output terminals X, Y is not used then the output transistor is open circuit and wastage of power is avoided.

FIG. 3 shows an embodiment of the invention based on a Schmitt trigger circuit configuration instead of the emitter coupled arrangement shown in FIG. 2. In FIG. 3 the circuit bias conditions are established by transistor VT6 and give the same compensation for drift with temperature as before. The considerations of power dissipation level also apply equally to this arrangement. The immunity to noise signals is, however, even better when using the Schmitt trigger configuration. This arises from the inherent hysteresis between the voltage level at the input terminals A and B and the resulting change in voltage at the base of transistor VT4, which is characteristic of the Schmitt trigger configuration. Thus a noise signal must rise to a considerably higher voltage level than in the emitter coupled arrangement, shown in FIG. 2, if it is to trigger the circuit.

When using the Schmitt trigger configuration it is possible to avoid saturation, while still working close to that condition, by a suitable choice of the ratios $R10/R1$ and $R10/R2$.

We claim:

A current steered logic circuit comprising first, second, third and fourth transistors each including a base, an emitter and a collector, the collectors of the first and second transistors being connected through a common load resistor and the collector of the third transistor being connected through a load resistor to a supply of one potential, the bases of the first, second and third transistors being connected through separate resistors to a supply of the other potential, the emitters of the first, second and third transistors being connected through a constant current source to said supply of the other potential, the base of the fourth transistor being connected to the collector of said second transistor and to one end of said common load resistor, the emitter of the fourth transistor being connected through another resistor to the base of the third transistor and the collector of the fourth transistor being connected to said supply of one potential, a pair of output transistors each have a base, an emitter and a collector, the bases of the output transistors being connected to the collectors of the second and third transistors, respectively, the collectors of the output transistors being connected to said supply of one potential, the emitters of the output transistors providing logic output terminals, logic input terminals being provided at the bases of the first and second transistors.

References Cited

UNITED STATES PATENTS

| | | | |
|---|---|---|---|
| 3,073,970 | 1/1963 | Bright | 307—88.5 |
| 3,259,761 | 7/1966 | Narud | 307—88.5 |

ARTHUR GAUSS, *Primary Examiner.*

D. D. FORRER, *Assistant Examiner.*